US010596758B2

(12) United States Patent
Mukhopadhyay

(10) Patent No.: US 10,596,758 B2
(45) Date of Patent: Mar. 24, 2020

(54) GAS PHASE INTEGRATED MULTIMATERIAL PRINTHEAD FOR ADDITIVE MANUFACTURING

(71) Applicant: Obsidian Advanced Manufacturing LLC, New Haven, CT (US)

(72) Inventor: Shomeek Mukhopadhyay, New York, NY (US)

(73) Assignee: OBSIDIAN ADVANCED MANUFACTURING, LLC, Princeton, NJ (US)

( * ) Notice: Subject to any disclaimer, the term of this patent is extended or adjusted under 35 U.S.C. 154(b) by 0 days.

(21) Appl. No.: 16/445,731

(22) Filed: Jun. 19, 2019

(65) Prior Publication Data

US 2019/0329492 A1 Oct. 31, 2019

Related U.S. Application Data

(62) Division of application No. 15/859,567, filed on Dec. 31, 2017, now Pat. No. 10,357,920.

(Continued)

(51) Int. Cl.
*B29C 64/209* (2017.01)
*B29C 64/159* (2017.01)
*C04B 35/622* (2006.01)
*C23C 14/34* (2006.01)
*B33Y 10/00* (2015.01)
*B22F 3/105* (2006.01)
*B29C 64/112* (2017.01)
*B33Y 30/00* (2015.01)

(52) U.S. Cl.
CPC .......... *B29C 64/209* (2017.08); *B22F 3/1055* (2013.01); *B29C 64/112* (2017.08); *B29C 64/159* (2017.08); *B33Y 10/00* (2014.12); *B33Y 30/00* (2014.12); *C04B 35/622* (2013.01); *C23C 14/34* (2013.01); *C23C 14/3421* (2013.01); *B22F 2003/1056* (2013.01); *B22F 2999/00* (2013.01); *B29C 2791/005* (2013.01)

(58) Field of Classification Search
CPC ... B29C 64/209; B29C 64/159; B29C 64/112; C04B 35/622; C23C 14/34; C23C 14/3421; B33Y 10/00; B22F 3/1055
See application file for complete search history.

(56) References Cited

U.S. PATENT DOCUMENTS 5,174,826 A * 12/1992 Mannava ............... C23C 16/047
   118/715
5,234,502 A * 8/1993 Mochizuki ............ C23C 16/511
   118/723 MW
8,815,709 B2 * 8/2014 Mangum ............... C23C 16/303
   438/478

* cited by examiner

*Primary Examiner* — Lamson D Nguyen
(74) *Attorney, Agent, or Firm* — Royse Law Firm, PC

(57) ABSTRACT

Sputtering printheads, additive manufacturing systems comprising the same, and methods for additive manufacturing are provided. Sputtering printheads of the present invention use a plasma to sputter a feedstock material which is directed towards a target. A printhead can include a heater to heat the feedstock to, or near, the material's melting point as it is being sputtered to increase the deposition rate. A convergent nozzle can also increase the deposition rate. Printheads of the present invention are readily reconfigurable such that the same printhead can be used to deposit different materials, such as metals and non-metals, in succession by replacing the feedstock material and making changes to a few settings. Additive manufacturing systems of the present invention can be operated at normal room temperatures and pressure.

8 Claims, 5 Drawing Sheets

Related U.S. Application Data

(60) Provisional application No. 62/447,388, filed on Jan. 17, 2017, provisional application No. 62/565,600, filed on Sep. 29, 2017, provisional application No. 62/570,605, filed on Oct. 10, 2017, provisional application No. 62/591,198, filed on Nov. 28, 2017.

GAS PHASE INTEGRATED MULTIMATERIAL PRINTHEAD FOR ADDITIVE MANUFACTURING

CROSS-REFERENCE TO RELATED APPLICATIONS

This application is a divisional application of U.S. patent application Ser. No. 15/859,567 filed on Dec. 31, 2017 and entitled "Gas Phase Integrated Multimaterial Printhead for Additive Manufacturing" which claims priority to U.S. provisional patent application No. 62/447,388 filed on Jan. 17, 2017 and entitled "Direct Metallic and Non-Metallic Additive Manufacturing using a Sputtering Based Rotating Print Head at Room Temperatures and Pressures;" U.S. patent application Ser. No. 15/859,567 also claims priority to U.S. provisional patent application No. 62/565,600 filed on Sep. 29, 2017 and entitled "Printhead for Additive Manufacturing of Metals and Ceramics using a Room Temperature Based Microsputtering Approach;" U.S. patent application Ser. No. 15/859,567 also claims priority to U.S. provisional patent application No. 62/570,605 filed on Oct. 10, 2017 and entitled "Additive Manufacturing Device Based on Microelectromechanical System (MEMS) Shutter Array and an Anticlogging Coating;" U.S. patent application Ser. No. 15/859,567 also claims priority to U.S. provisional patent application No. 62/591,198 filed on Nov. 28, 2017 and entitled "Additive Manufacturing Print Head Based on Liquid Phase Micro-Sputtering Approach and a Nanoparticle Gun for Deposition Rate Enhancement;" each of the aforementioned patent applications are incorporated herein by reference.

BACKGROUND

Field of the Invention

The invention is in the field of additive manufacturing and more particularly to a printhead that employs sputtering to deposit metals, ceramics, or plastics.

Related Art

Current methods for metal additive manufacturing (laser-sintering or e-beam melting) require high temperatures to locally melt the material. These manufacturing techniques also have certain limitations including the range of compounds they can produce and the consistency and mechanical properties of the desired output. Current approaches to 3D printing of metallic objects use high temperatures achieved through the use a directed energy source, see Bourell, D. L., (2016), *Perspectives on Additive Manufacturing, Annual Reviews of Materials Research*, 46 (1-18). There are two major approaches for metallic additive manufacturing, laser sintering of a fine metal powder in a localized area, and arc-welding in the region of interest. Both approaches are associated with high costs, at least ten times the input costs of conventional manufacturing techniques. Furthermore, the products are characterized by inconsistent strengths and a tendency to fracture. These approaches are also limited to materials that can be sintered or arc-welded. For example, semiconductors and oxides can be sputtered but not arc welded. These impediments slow progress and frustrate manufacturing organizations trying to move from prototyping into production. Babu, S., Love, L. J., Peter, W., and Dehoff R., 2016, *Report on Additive Manufacturing for Large Scale Metals Workshop, Oak Ridge National Laboratory (ORNL)*, Knoxville Tenn., p. 37 (http://info.ornl.gov/sites/publications/files/Pub62831.pdf), and Collins, P. C., Brice, D. A., Samimi, P., Ghamarian, I., Fraser, H. L., (2016), *Microstructure Control of Additively Manufactured Metallic Materials, Annual Reviews of Materials Research*, 46(63).

Further, presently, no single additive manufacturing tool can handle both electrically conductive and insulating materials. The current state of the art uses a robot arm to move the part to be manufactured between a polymer machine, a metallic, and/or a ceramic machine. Current metallic additive manufacturing also requires special handling in an inert atmosphere which is free of oxygen and a significant amount of post processing after the material is deposited.

SUMMARY

An exemplary additive printhead of the present invention, suitable for printing 3D objects, comprises a tube attached and aligned with an annular structure. In the exemplary printhead, a gas manifold is in fluid communication with a first end of the tube, while the opposite end of the tube opens into a central bore of the annular structure. The annular structure includes a magnet and an electrically conductive material, and the bore extends through both. The exemplary printhead further comprises a mechanism configured to retain a feedstock material within the tube and further configured to advance the feedstock material towards the bore as the feedstock material is consumed. The exemplary printhead comprises, further still, a plasma excitation source configured to create a plasma within the bore of the annular structure. In various embodiments of the exemplary printhead, the printhead further comprises the feedstock material, while in other embodiments the printhead does not include the feedstock material but is configured to receive the feedstock material.

In various embodiments of the exemplary printhead, the annular structure further includes a spacer between the magnet and the conductive material, and in some of these embodiments the spacer includes a through-hole extending radially to the bore to provide fluid communication through the spacer to the bore. In further embodiments, the plasma excitation source is a power supply that is configured to provide the voltage between the feedstock material and the conductive material. In some of these embodiments a first electrical connection is made from the power supply to the conductive material and a second electrical connection is made from the power supply to the feedstock material. In some of these embodiments the second connection passes through the through-hole in the spacer. In various embodiments, the exemplary printhead further comprises a heater configured to heat an end of the feedstock material proximate to the annular structure, at such times as a feedstock material is being retained by the mechanism. In various embodiments, the exemplary printhead further comprises a convergent nozzle attached to an end of the annular structure opposite to an end thereof attached to the tube.

An exemplary additive manufacturing system of the present invention comprises a sputtering printhead, as just described, and a repositionable stage configured to retain a target proximate to the sputtering printhead. The additive manufacturing system can further comprise one or more gas sources in fluid communication with the gas manifold.

An exemplary method for the additive manufacturing of a 3D object comprises at least some of the steps of heating a feedstock material within a printhead, creating a plasma proximate to the feedstock material, also within the printhead, injecting microwave energy into the plasma, advancing the feedstock material, directing the physical vapor onto a target, and replacing the feedstock material to create a second layer of the 3D object. These steps can be carried out at about one atmosphere of pressure and at room temperature. In various embodiments, creating the plasma includes applying an AC or a DC voltage to a gas within the printhead. In other embodiments, creating the plasma includes applying RF energy to the gas within the printhead.

DETAILED DESCRIPTION OF THE INVENTION

Figure 1:
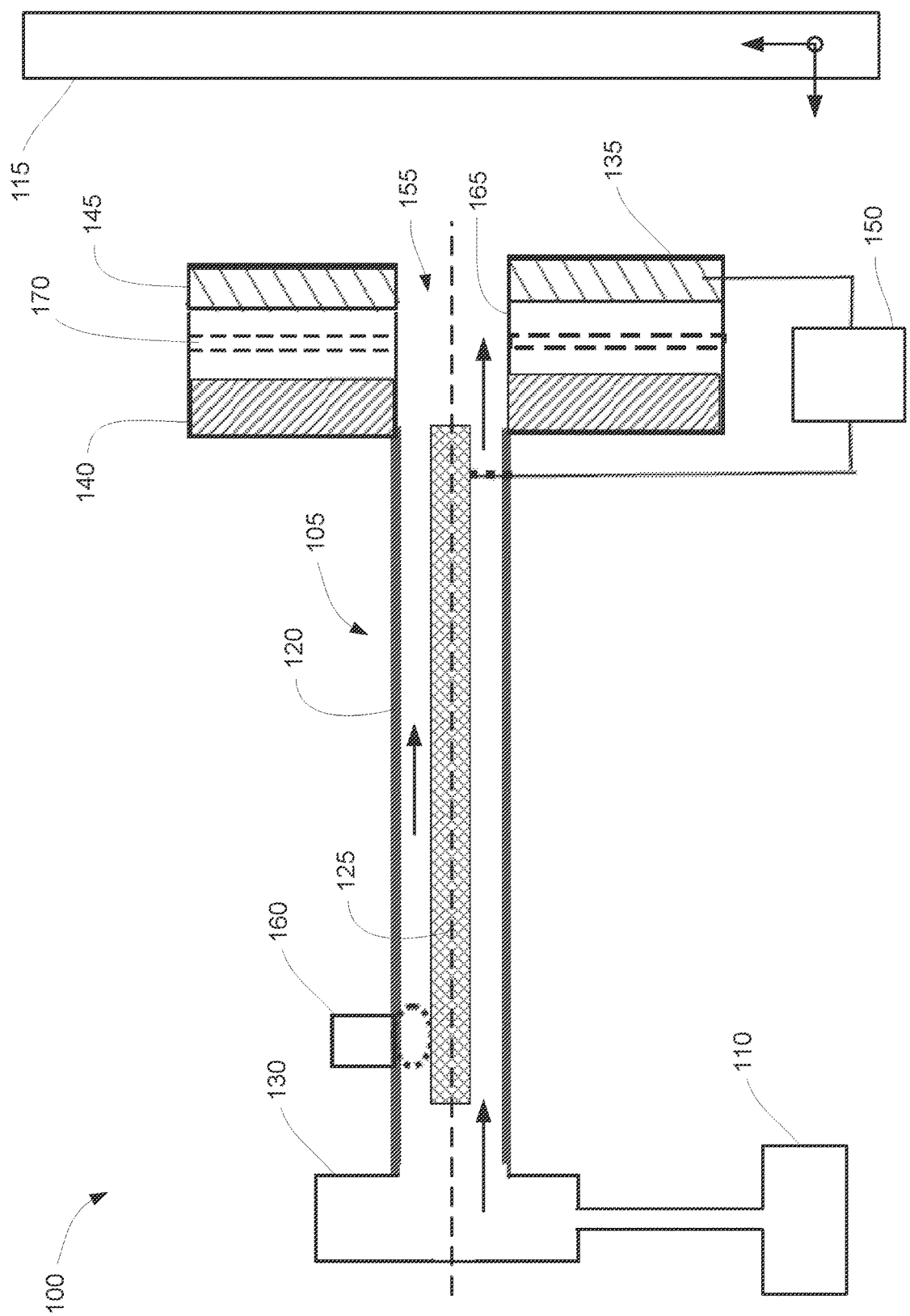
FIG. 1 is a schematic representation of an additive printing system according to various embodiments of the present invention.

The present invention is directed to sputtering printheads, additive manufacturing systems comprising one or more of such printheads, and methods for additive manufacturing. Sputtering printheads of the present invention place a material to be sputtered proximate to an annular assembly that includes both an annular magnet and an annular electrically conductive material. A plasma is produced in a bore of the annular structure, and the material next to one end of the bore is sputtered by the plasma, with the sputtered material being expelled through the opposite end of the bore to exit the printhead. In operation, a gas is directed through the printhead and out through the bore, the plasma is generated from some of the flowing gas within the space between the conductive layer and the material to be sputtered, and that plasma then sputters the material. The sputtered material is directed through the bore by the annular magnet and carried out of the bore and towards the target by the flowing gas. In some embodiments the printhead includes a heater to heat the material to, or near, the material's melting point as it is being sputtered to increase the deposition rate. A convergent nozzle extending from the end of the bore can also increase the deposition rate. Printheads of the present invention are readily reconfigurable such that the same printhead can be used to deposit different materials in succession by replacing the feedstock material and making changes to a few settings.

Additive manufacturing systems of the present invention comprise one or more printheads as just described, as well as a repositionable stage or fixture configured to hold a target or substrate onto which a 3D object can be manufactured. The repositionable stage comprises translational mechanisms for moving the target and printhead(s) relative to one another to reposition the area of deposition and to maintain a proper spacing between the printhead and the 3D object being manufactured. Additive manufacturing systems of the present invention further comprise a control system configured to regulate various parameters such as the gas flow, control the plasma, monitor the deposition rate, control any heating of the material to be sputtered, and so forth. Additive manufacturing systems of the present invention can be operated at ambient temperatures and pressures and the printheads can be used to deposit both metals and non-metals alike. Some embodiments can deposit kilograms of the material per hour.

Methods for additive manufacturing of a 3D object, according to the present invention, comprise creating, such as within a printhead, a plasma proximate to a material to be sputtered, and directing sputtered material from the printhead onto a target. The plasma can be created by applying to a gas any of a DC voltage, an AC voltage, an AC voltage on top of a DC bias, or by applying radio-frequency (RF) energy in order to ionize the gas. Methods of the invention can also comprise advancing the material within the printhead as the material is being sputtered. In some embodiments, methods further comprise heating the material to be sputtered to near or to the material's melting point. In further embodiments, successive layers of the 3D object are created by replacing one type of feedstock for another, such as replacing a metal feedstock with a non-metal feedstock in the printhead. Methods can also comprise injecting microwave energy into the plasma. Methods can also comprise operating at or near room temperature and/or at normal atmospheric pressures.

FIG. 1 illustrates an exemplary additive printing system 100 of the present invention. The system 100 comprises a sputtering printhead 105, a gas supply 110 that provides a gas to the printhead 105, and a stage 115 to support a target on which the printhead 105 deposits material. The system 100 further comprises one or more mechanisms (not shown) for moving the stage 115 relative to the printhead 105, which can include mechanisms for translational movements in the X-Y plane, rotational movements of the printhead 105 relative to the stage 115, and vertical movements to vary the spacing between the target and the printhead 105. An exemplary spacing is about 10 mm, but other spacings are employed. Stepper motors and piezoelectric actuators are but two examples of suitable mechanisms for these purposes.

It is noted that the system 100 does not have to be operated under reduced pressure, and while a housing may be employed around the system 100 to keep out particulates, an enclosure sufficient to maintain a vacuum or partial vacuum in the system 100 is not required. As such, the system 100 can be operated at normal atmospheric pressure. While not required, it is further noted that the system 100 can be placed in a vacuum enclosure and operated at pressures below normal atmospheric pressure.

FIG. 1 further provides a schematic cross-section of the sputtering printhead 105 for additive manufacturing, according to various embodiments of the present invention. The printhead 105 comprises a tube 120 including a feedstock material 125, a gas manifold 130 at one end of the tube 120 and an annular structure 135 at the other end of the tube 120, the annular structure 135 including a magnet 140 and a conductive material 145. A power supply 150 is in electrical communication with both the conductive material 145 and the feedstock material 125 to produce a voltage across the space therebetween sufficient to create a plasma of the gas therein.

In operation, an end of the feedstock material 125, which can be in the shape of a rod, for example, is disposed proximate to the annular structure 135 and sputtered by the plasma and a beam of the sputtered material is expelled through a bore 155 extending through the annular structure 135 towards a target on the stage 115 onto which the sputtered material is deposited. The printhead 105 can be operated with a wide range of materials for the feedstock material 125, including metals, ceramics, semiconductors, and plastics. In various embodiments, the system 100 includes two or more printheads 105 (not shown) that can be operated alternatingly on a same area, or in parallel on different areas, of the target. In this way, structures including multiple different materials can be fabricated. For instance, several printheads 105, each with a different material for the feedstock, can be arranged in a turret.

The tube 120 of the printhead 105 is a housing that is characterized by two ends and a longitudinal axis, and in various embodiments the tube 120 is symmetric around that axis, such that a cross-section of the tube 120 taken perpendicular to the longitudinal axis is circular, for example. The tube 120 is capped at one end by the gas manifold 130 and open at the other end where the tube 120 engages with the annular structure 135. The tube 120 is hollow so as to accommodate the feedstock material 125 within the tube 120 with sufficient space around the feedstock material 125 to allow a gas, provided by the gas manifold 130, to flow around the feedstock material 125 and out through the open end of the tube 120 and through the bore 155 in the annular structure 135. The feedstock material 125 can be characterized by a longitudinal axis and can have a cross-section, taken perpendicular to the longitudinal axis, that is symmetric around the axis, such as circular, for example. In addition to a rod, the feedstock material 125 can additionally take the form of a disk, a wire, a strip, an ingot, and so forth.

The tube 120 also houses a mechanism 160 that engages with the feedstock material 125 and is configured to retain the feedstock material 125 and advance it towards the bore 155 as the end of the feedstock material 120 is sputtered. Exemplary mechanisms 160 for advancing the feedstock material 125 include a stepper motor and a spring-loaded positioner. One or both of the gas manifold 130 or annular structure 135 are readily detachable from the tube 120 to allow access to the interior of the tube 120 to allow for cleaning and for the feedstock material 125 to be replaced.

The gas manifold 130 is in fluid communication with the end of the tube 120 opposite from the annular structure 135 and in further fluid communication with the gas supply 110. As noted, this gas is ionized within the printhead 105 and used to sputter material from the feedstock material 125. Suitable gases include both reactive and inert gases, where a suitable inert gases are argon and nitrogen. The gas manifold 130 includes a regulator to control the flow of gas into the tube 120, and in various embodiments can have multiple inputs to receive more than one type of gas from additional gas supplies 110. This can allow more than one gas to be used at once, but also can allow different gases to be used with different feedstock materials 125.

As previously noted, the feedstock material 125 is disposed within the tube 120. In some embodiments, the feedstock material 125 is aligned with the longitudinal axis of the tube 120. "Aligned," as used herein to describe two structures, means the structures have longitudinal axes that are either coaxial or parallel. In some embodiments, a feedstock material 125 made of one material can be readily replaced with a feedstock material 125 made of a different material, and then returned to operation. As discussed below, changing the material to be deposited may involve a change to a supplied gas and may involve a change in operation between an AC, DC, or RF modes, but the printhead 105 itself is readily adaptable between different deposition materials.

The annular structure 135 includes a magnet 140 and an electrically conductive material 145. From the cross-sectional view, it can be see that the magnet 140 and the conductive material 145 form parallel layers with a gap therebetween. Various embodiments provide an electrically insulating spacer 165, such as of plexiglass or acrylic, disposed between the magnet 140 and conductive material 145. The annular structure 135 includes a central bore 155 therethrough, as previously indicated, that extends through all of the layers of the annular structure 135. The annular structure 135 also defines a longitudinal axis around which the bore 155 and the annular structure 135 are both symmetric. The annular structure 135 is attached to the end of the tube 120 such that the bore 155 is aligned with the longitudinal axis of the tube 120. This can be achieved where the longitudinal axis of the annular structure 135 is parallel with, or coaxial to, the longitudinal axis of the tube 120. In one embodiment, the outer diameter of the annular structure 135 is about 75 mm while the diameter of the bore 155 is about 19 mm and the thickness of the spacer 165 is about 25 mm.

The annular structure 135 is arranged such that the magnet 140 is closer to the feedstock material 125 than the conductive material 145. In some embodiments the conductive material 145 includes copper. The magnet 140 can be, in various embodiments, a permanent magnet such as those that include one or more rare earth elements like samarium. In further embodiments the magnet 140 is an electromagnet. The magnetic field produced by the magnet 140 steers and focuses the charged particles that are sputtered from the feedstock material 125. Exemplary magnets 140 suitable for these systems 100 produce on the order of a 1.5 T magnetic field.

The spacer 165 can optionally include one or more through-holes 170 extending radially through the thickness of the spacer 165. In embodiments comprising multiple through-holes 170, the holes 170 are optionally arranged symmetrically around the longitudinal axis of the annular structure 135. As described further below, through-holes 170 can be used for electrical access, to direct microwaves into the bore 155, or to introduce other gases into the bore 155.

The printhead 105 further comprises a power supply 150 configured to provide a voltage between the conductive material 145 and the feedstock material 125. The power supply 150 can be switchable to supply either AC or DC, to accommodate sputtering different materials. In various embodiments the power supply 150 is external to the tube 120 and makes an electrical connection to both the conductive material 145 and the feedstock material 125 to make the feedstock material 125 into an electrode and the conductive material 145 into a counter-electrode. For example, the feedstock material 125 can be the cathode and the conductive material 145 can be the anode when the power supply 150 is operated to provide a DC current. The electrical connection between the feedstock material 125 and the power supply 150 can be passed through a through-hole 170 and can make a connection to the feedstock material 125 with a spring clip or brushes in different embodiments.

In operation, a gas is supplied through the gas manifold 130 and into the tube 120 which flows around the feedstock material 125 to the annular structure 135 where the electric field between the end of the feedstock material 125 and the conductive layer 145 ionizes the gas to produce a localized plasma that sputters the end of the feedstock material 125. The sputtering produces a physical vapor for deposition which also becomes charged in the electric field and guided into the bore 155 by the magnet 140. The flowing gas carries the sputtered vapor out through the bore 155 and towards the target. At atmospheric pressure, the plasma of the sputtered material tends to stay concentrated in a filament.

Figure 2:
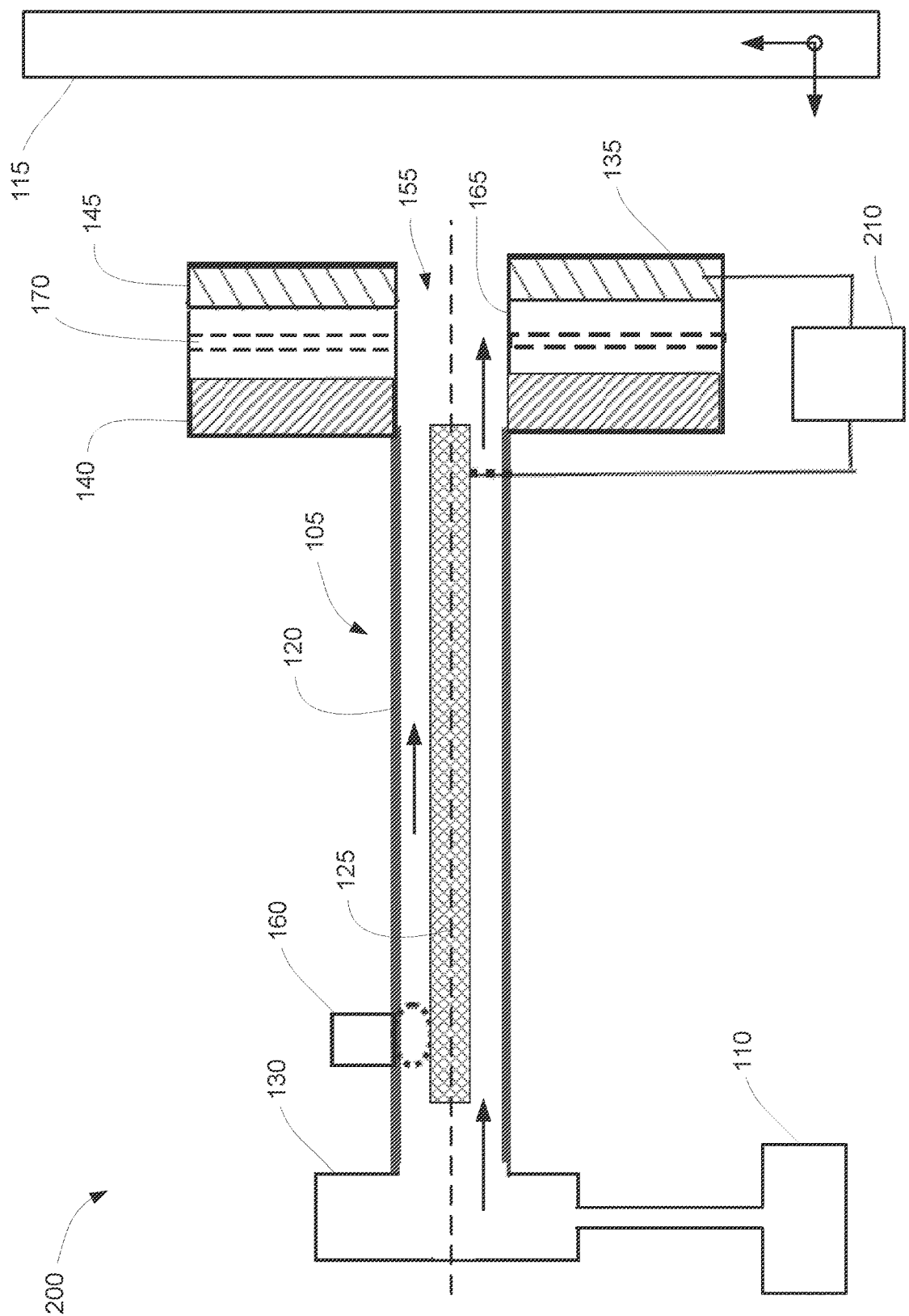
FIG. 2 is a schematic representation of another additive printing system according to various embodiments of the present invention.

FIG. 2 illustrates another exemplary additive printing system 200 of the present invention. System 200 replaces the power supply 150 of FIG. 1 with an RF source 210 that provides radio-frequency energy to the gas to produce the sputtering plasma. RF source 210 and power supply 150 are two examples of plasma excitation sources. Some systems of the present invention include both a power supply 150 and an RF source 210 and can be readily switched between them, or can employ both simultaneously.

Figure 3:
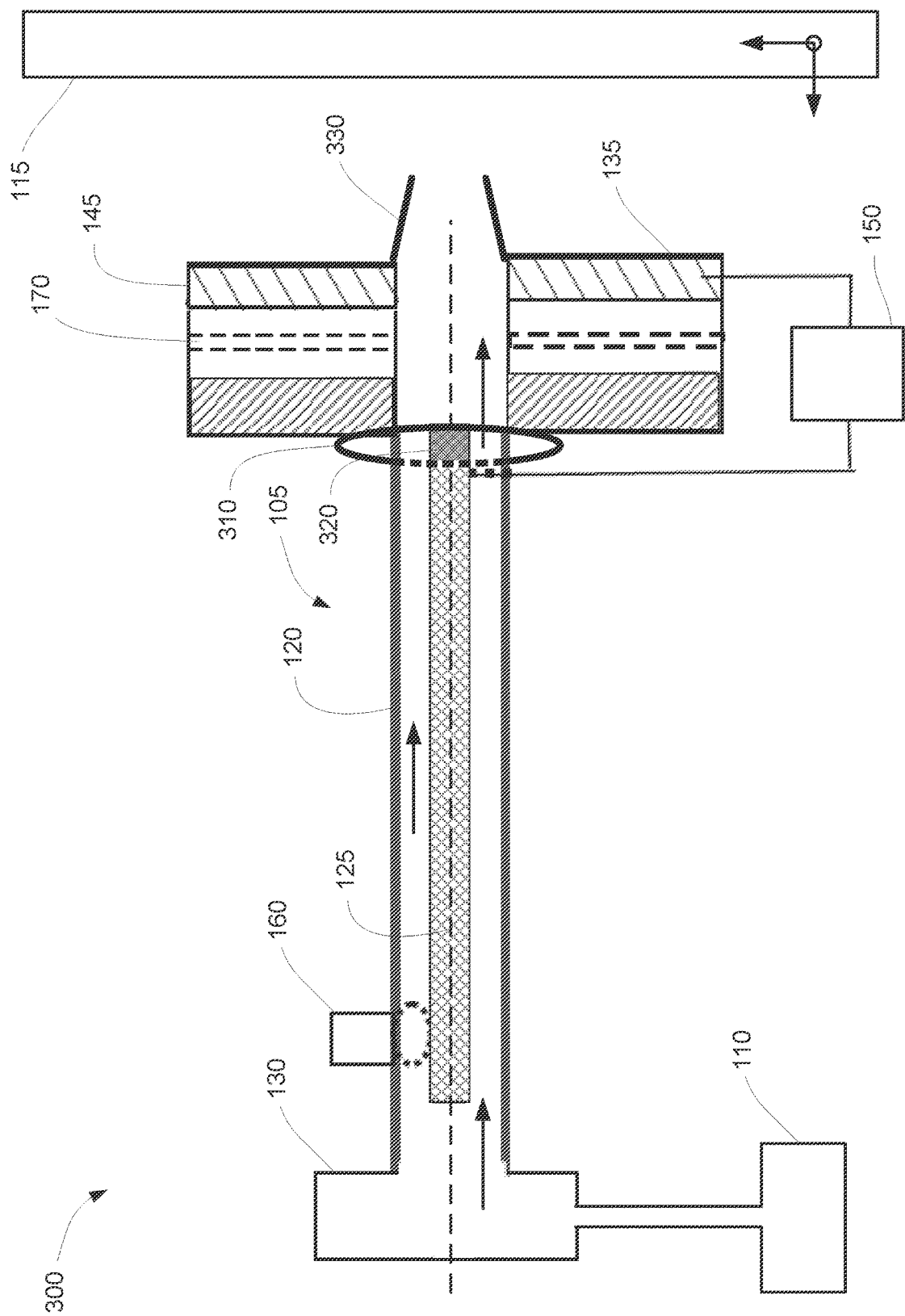
FIG. 3 is a schematic representation of still another additive printing system according to various embodiments of the present invention.

FIG. 3 illustrates another exemplary additive printing system 300 of the present invention. System 300 adds to the system 100 both a heater 310 for raising the temperature of an end 320 of the feedstock material 125 nearest the annular structure 135, and a convergent nozzle 330 attached to an end of the annular structure 135 furthest from the feedstock material 125. Heater 310 can employ induction to produced localized heating in the end 320, in some embodiments. In various embodiments, the heater 310 comprises an RF coil disposed around the outside of the tube 120.

In certain embodiments, the heater 310 is used to raise the temperature of the end 320 to, or near to, the melting point of the material. For example, the temperature can be raised to within 5% of the melting point as measured in degrees Kelvin. In further embodiments, the feedstock material 125 comprises a material that is a mixture of two or more substances, such as a metallic alloy, and in some of these embodiments the composition of the mixture constitutes a eutectic, which is the composition with the lowest melting point of all possible compositions for a mixture of those substances. As such, eutectic compositions require less heating to reach the eutectic temperature, and also melt completely at the eutectic temperature. Sputtering at or near the melting point of a material can enhance deposition rates (e.g. 0.5 to 1 kilograms per hour for metals and 1.5 to 2 kilograms per hour for ceramics). Where the end 320 is heated to near melting, less energy is needed to dislodge material. Therefore, a plasma applied to a material at or near melting will sputter more material than the same plasma applied to the same material but well below the melting point.

Figure 4:
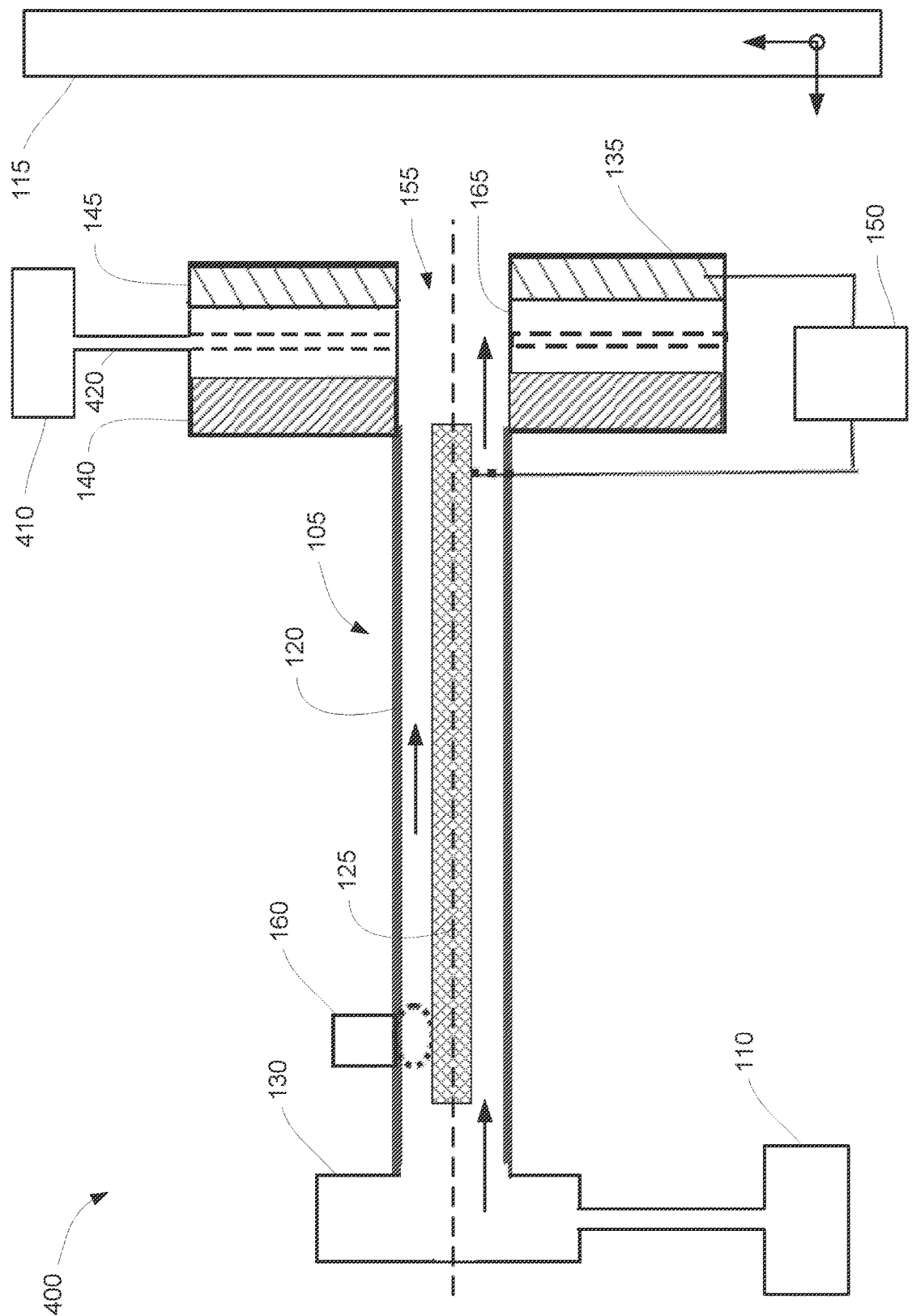
FIG. 4 is a schematic representation of still another additive printing system according to various embodiments of the present invention.

Deposition rates can be further increased by using the convergent nozzle 330. By converging, the nozzle 330 increases the velocity and decreases pressure which has the effect of condensing the emitted target material into larger nanoparticles before deposition FIG. 4 illustrates still another exemplary additive printing system 400 of the present invention. System 400 adds to the system 100 a microwave source 410 configured to provide microwave power into the bore 155. Microwave power can be introduced though the through-hole 170 from microwave source 410, which can be a 2.45 GHz source, for example. The microwave frequency can optionally be adjusted, as well as the peak power. In some embodiments, a suitable power range extends from a few watts to 3 kilowatts.

The microwave source 410 is coupled into the bore 155 by a waveguide 420. The waveguide 420 is basically a hollow metallic cylinder. Addition of the microwave source 410 helps to produce a high and uniform plasma with very high electron density which assists in rapid and uniform material deposition. It is noted that the various features of the heater 310, nozzle 330, and microwave source 410 can be used in any combination, though shown in separate drawings.

As noted, through-holes 170 in the spacer 165 can also be used to deliver reactive gases into the bore 155. Such gases include organosilane, hydrogen, acetylene, tungsten hexafluoride, triisobutylaluminum, and related pentachloride gases for depositing metals. These gases can also, or in the alternative, be introduced along with the carrier gas through the gas manifold 130.

Figure 5:
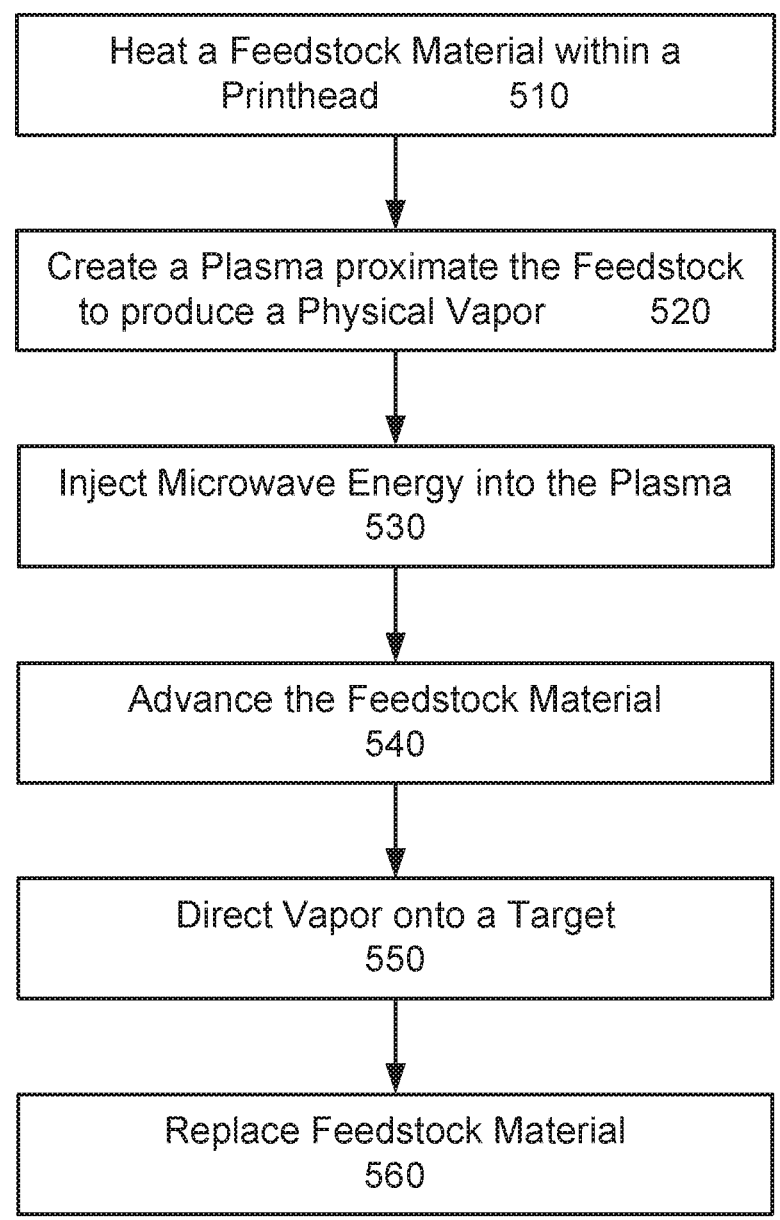
FIG. 5 is a flowchart representation of a method according to various embodiments of the present invention.

FIG. 5 provides a flowchart representation of an exemplary method 500 of the present invention. The method 500 is directed to the additive manufacturing of a 3D object and comprises an optional step 510 of heating a feedstock material within a printhead, and a step 520 of creating a plasma proximate to the feedstock material and also within the printhead, where the plasma sputters the feedstock material to produce a physical vapor. The method 500 also comprises an optional step 530 of injecting microwave energy into the plasma, an optional step 540 of advancing the feedstock material, and a step 550 of directing the physical vapor onto a target. Method 500 can further comprise a step 560 of replacing the feedstock material to create a second layer of the 3D object. The steps of method 500 are shown in FIG. 5 as sequential but it will be understood that various steps may be performed together or iteratively, for instance, the steps 510-550 can all be performed simultaneously in some embodiments. These steps can also be carried out at ambient temperatures and at or around one atmosphere pressure.

In step 510 the feedstock material is heated by a heater, for example by an RF coil disposed outside of the printhead and positioned proximate to a sputtering zone within the printhead. In various embodiments, the step includes heating the feedstock material to within 5% of the material's melting point, or to the melting point. The step can also include monitoring the temperature of the feedstock material with an infra-red (IR) sensor, for example, and controlling the power to the heater with a controller. Proportional-integral-derivative (PID) controls may be used for this and other feedback controls used herein.

In step 520 a plasma is created within the printhead proximate to the feedstock material in order to sputter the feedstock material to produce a physical vapor. This step can include flowing a gas through the printhead. Creating the plasma can include, depending on the material to be sputtered, applying a DC voltage to the gas within the printhead, an AC voltage to the gas, or RF energy to the gas. Step 520 can also include adding a reactive gas to the system, either along with a carrier gas through a gas manifold, or separately via a through-hole in the spacer.

In step 530 microwave energy is optionally injected into the plasma, such as from a microwave source via a waveguide. In various embodiments, the microwaves are supplied at a frequency of 2.45 GHz, as one example. The step can include varying the frequency and peak power. In some embodiments, a suitable power range extends from a few watts to about 3 kilowatts.

In step 540 the feedstock material is advanced within the printhead as the feedstock material is being sputtered. This can include controlling a mechanism configured to advance the feedstock material, such as a stepper motor. This can also include controlling the rate at which the feedstock material is advanced, such as based on the deposition rate. The rate can also be controlled based on measuring the capacitance between the feedstock and the conductive material 145, or by optical means to measure the distance to the feedstock material.

In step 550 the physical vapor is directed onto a target to produce a first layer of the 3D object. Directing the physical vapor onto the target can include magnetically steering the physical vapor, as well as passing the vapor through a convergent nozzle. This step can also comprise repositioning a stage supporting the target while the physical vapor is directed onto the target, as well as continuously controlling the position of the target and separation between the printhead and the target.

In step 560 a second layer of the 3D object is created. In this step the feedstock material is replaced with another so the second layer is compositionally different from the first layer of the 3D object. Step 560 can include opening the printhead, removing the existing feedstock material, replacing a new feedstock material of a different composition, and closing the printhead. The step can also comprise switching a mode of operation between any one of DC, AC, and RF to create the plasma in a next iteration of step 520. For instance, DC can be used with conductive feedstocks like metals, AC and RF can be used on non-metals like ceramics, semiconductors, and plastics.

The descriptions herein are presented to enable persons skilled in the art to create and use the printheads and additive manufacturing systems and methods described herein. Various modifications to the embodiments will be readily apparent to those skilled in the art, and the generic principles defined herein may be applied to other embodiments and applications without departing from the spirit and scope of the inventive subject matter. Moreover, in the following description, numerous details are set forth for the purpose of explanation. However, one of ordinary skill in the art will realize that the inventive subject matter might be practiced without the use of these specific details. In other instances, well known machine components, processes and data structures are shown in block diagram form in order not to obscure the disclosure with unnecessary detail. Identical reference numerals may be used to represent different views of the same item in different drawings. Flowcharts in drawings referenced below are used to represent processes. A hardware processor system may be configured to perform some of these processes. Modules within flow diagrams representing computer implemented processes represent the configuration of a processor system according to computer program code to perform the acts described with reference to these modules. Thus, the inventive subject matter is not intended to be limited to the embodiments shown, but is to be accorded the widest scope consistent with the principles and features disclosed herein.

The use of the term "means" within a claim of this application is intended to invoke 112(f) only as to the limitation to which the term attaches and not to the whole claim, while the absence of the term "means" from any claim should be understood as excluding that claim from being interpreted under 112(f). As used in the claims of this application, "configured to" and "configured for" are not intended to invoke 112(f).

What is claimed is:

1. A method for the additive manufacturing of a 3D object, the method comprising:
   heating a feedstock material within a printhead to at least 5% of a melting point of the feedstock material;
   creating, within the printhead, a plasma proximate to the feedstock material in order to sputter the feedstock material to produce a physical vapor; and
   directing the physical vapor from the printhead onto a target to produce a first layer of the 3D object.

2. The method of claim 1 further comprising injecting microwave energy into the plasma.

3. The method of claim 1 further comprising operating at about one atmosphere of pressure.

4. The method of claim 1 further comprising advancing the feedstock material within the printhead as the feedstock material is being sputtered.

5. The method of claim 1 further comprising creating a second layer of the 3D object by removing the feedstock material from within the printhead and replacing the feedstock material with a different feedstock material.

6. The method of claim 1 wherein creating the plasma includes applying a DC voltage to a gas within the printhead.

7. The method of claim 1 wherein creating the plasma includes applying an AC voltage to a gas within the printhead.

8. The method of claim 1 wherein creating the plasma includes applying RF energy to a gas within the printhead.

* * * * *